United States Patent
Mousa et al.

(10) Patent No.: US 7,863,117 B2
(45) Date of Patent: Jan. 4, 2011

(54) MULTILAYER SILICON OVER INSULATOR DEVICE

(75) Inventors: Mahmoud A. Mousa, South Burlington, VT (US); Christopher S. Putnam, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 11/961,356

(22) Filed: Dec. 20, 2007

(65) Prior Publication Data

US 2008/0108185 A1    May 8, 2008

Related U.S. Application Data

(62) Division of application No. 10/711,167, filed on Aug. 30, 2004, now Pat. No. 7,348,658.

(51) Int. Cl.
| | |
|---|---|
| H01L 21/00 | (2006.01) |
| H01L 21/84 | (2006.01) |
| H01L 21/338 | (2006.01) |
| H01L 21/337 | (2006.01) |
| H01L 21/336 | (2006.01) |
| H01L 21/8234 | (2006.01) |
| H01L 21/76 | (2006.01) |

(52) U.S. Cl. ............... 438/150; 438/168; 438/187; 438/198; 438/412; 257/E21.32; 257/E27.112; 257/E29.273

(58) Field of Classification Search .......... 438/150, 438/168, 187, 198, 311, 412, 479, 982, 118, 438/406, 455–459, 615–617; 257/347, E27.112, 257/E21.32, E21.545, E21.561, E21.564, 257/E33.003, E21.036, E21.233, 625, 676, 257/779–783, 784–785, E27.137, E27.144, 257/E27.161, E23.023, E23.077, E21.122–E21.128, 257/E21.48, E21.512, E21.519, E21.567–E21.57, 257/E21.087–E21.088, E21.6–E21.601, E29.273
See application file for complete search history.

(56) References Cited

U.S. PATENT DOCUMENTS 3,603,848 A * 9/1971 Sato et al. ............ 257/255

(Continued)

*Primary Examiner*—David S Blum
(74) *Attorney, Agent, or Firm*—Richard Kotulak; Roberts Mlotkowski Safran & Cole, P.C.

(57) ABSTRACT

An apparatus and method for a multilayer silicon over insulator (SOI) device is provided. In the multilayer SOI device, the crystal orientation of at least one active region of a device is different than the active region of at least another device. Where the multilayer SOI device has a first layer including a PMOS device with a silicon active region having a crystal orientation of [100], the second layer may be an NMOS device with a active region having a silicon layer having a crystal orientation of [110]. The second layer is bonded to the first layer. The method and apparatus can be extended to more than two layers thus forming a multilayer SOI device having a different crystal orientation at each layer. The multiple layer SOI device may form circuits of reduced surface area.

14 Claims, 4 Drawing Sheets

U.S. PATENT DOCUMENTS

| | | | |
|---|---|---|---|
| 5,384,473 A * | 1/1995 | Yoshikawa et al. | 257/255 |
| 5,880,010 A | 3/1999 | Davidson | |
| 5,976,953 A | 11/1999 | Zavracky et al. | |
| 6,228,691 B1 * | 5/2001 | Doyle | 438/149 |
| 6,509,639 B1 | 1/2003 | Lin | |
| 6,544,837 B1 | 4/2003 | Divakauni et al. | |
| 6,624,046 B1 | 9/2003 | Zavracky et al. | |
| 6,627,953 B1 * | 9/2003 | Vu et al. | 257/347 |
| 6,821,826 B1 | 11/2004 | Chan et al. | |
| 2003/0148590 A1 | 8/2003 | Kellar et al. | |
| 2004/0144979 A1 * | 7/2004 | Bhattacharyya | 257/67 |
| 2005/0275017 A1 * | 12/2005 | Pozder et al. | 257/347 |
| 2006/0175649 A1 * | 8/2006 | Bhattacharyya | 257/296 |
| 2006/0226491 A1 * | 10/2006 | Gauthier et al. | 257/369 |

* cited by examiner

MULTILAYER SILICON OVER INSULATOR DEVICE

CROSS REFERENCE TO RELATED APPLICATIONS

This application is a divisional of U.S. patent application Ser. No. 10/711,167, filed Aug. 30, 2004, now U.S. Pat. No. 7,348,658, of which the disclosure of which is expressly incorporated by reference herein in its entirety.

BACKGROUND OF INVENTION

1. Field of the Invention

The invention relates to stacked circuits, and more particularly to stacked circuits having different crystal orientations.

2. Background Description

SOI (silicon over insulator) technology eliminates bulk CMOS latch-up. SOI technology additionally reduces junction capacitance and allows circuits to operate at higher speeds. Accordingly, SOI technology allows a higher circuit density to be achieved on a silicon wafer.

SOI technology can be applied to many levels of devices. Each level of a multilevel SOI technology based device may be interconnected using vertical plugs which additionally allows metal connections to be used at any level. In a multi-level device, NMOS and PMOS devices may each be restricted to a separate level, or NMOS and PMOS devices may be intermixed on a single level.

For some types of semiconductor devices, it is advantageous to have multiple layers of similar semiconductor material, where each layer has a crystal orientation different from the adjoining layers. However, multi-layer devices are formed with similar semiconductor material having the same crystal orientation from one level to the next. This limitation imposed on the crystal orientation across multiple levels of an integrated circuit results from constraints imposed by the fabrication process.

In particular, semiconductor material is traditionally grown from a pre-existing layer of semiconductor material. During the material growth process, the atoms of the newly formed layer have a strong tendency to orient themselves to the pre-existing substrate's crystal structure as they are laid down. Thus, it becomes very difficult to create a new layer of similar semiconductor material having a crystal orientation which is different from the underlying layer.

SUMMARY OF INVENTION

In a first aspect of the invention, a method of forming a circuit includes forming a lower semiconductor device having an active region comprising a semiconductor with a first crystal orientation, and forming an upper semiconductor device having an active region comprising a semiconductor with a second crystal orientation. The method also includes superimposing the upper semiconductor device on the lower semiconductor device.

In another aspect of the invention, a method of forming an inverter includes forming a lower semiconductor layer comprising a first crystal orientation, and forming at least one lower source/drain region in the lower semiconductor layer. The method also includes forming a lower gate on the lower semiconductor layer to define an active region in the lower semiconductor layer, and forming an upper semiconductor layer comprising a second crystal orientation. The method additionally includes forming at least one upper source/drain region in the upper semiconductor layer, and forming an upper gate on the upper semiconductor layer to define an active region in the upper semiconductor layer. The method further includes bonding the upper semiconductor layer to the lower semiconductor layer, and electrically connecting the at least one lower source/drain region to the at least one upper source/drain region.

In another aspect of the invention, a circuit includes a lower semiconductor device having an active region comprising a semiconductor with a first crystal orientation, and an upper semiconductor device having an active region comprising a semiconductor with a second crystal orientation, wherein the upper semiconductor device is superimposed on the lower semiconductor device.

DETAILED DESCRIPTION

In embodiments of the invention, a first CMOS device, such as a pFET, is formed having a first crystal orientation in the active region of the device, and a second CMOS device, such as an nFET, is formed having a second orientation in the active region of the second device. After both devices are formed, the second device is bonded to the first device with a bonding layer such as $SiO_2$ forming a stacked or layered arrangement. Once the two devices are bonded in the stacked arrangement, the devices are interconnected with conductive pathways such as tungsten plugs and/or metal interconnects. Thus, it is possible to form stacked layers of CMOS devices where each layer has either the same or a different crystal orientation in the active region as a layer below it and/or a layer above it.

Figure 1:
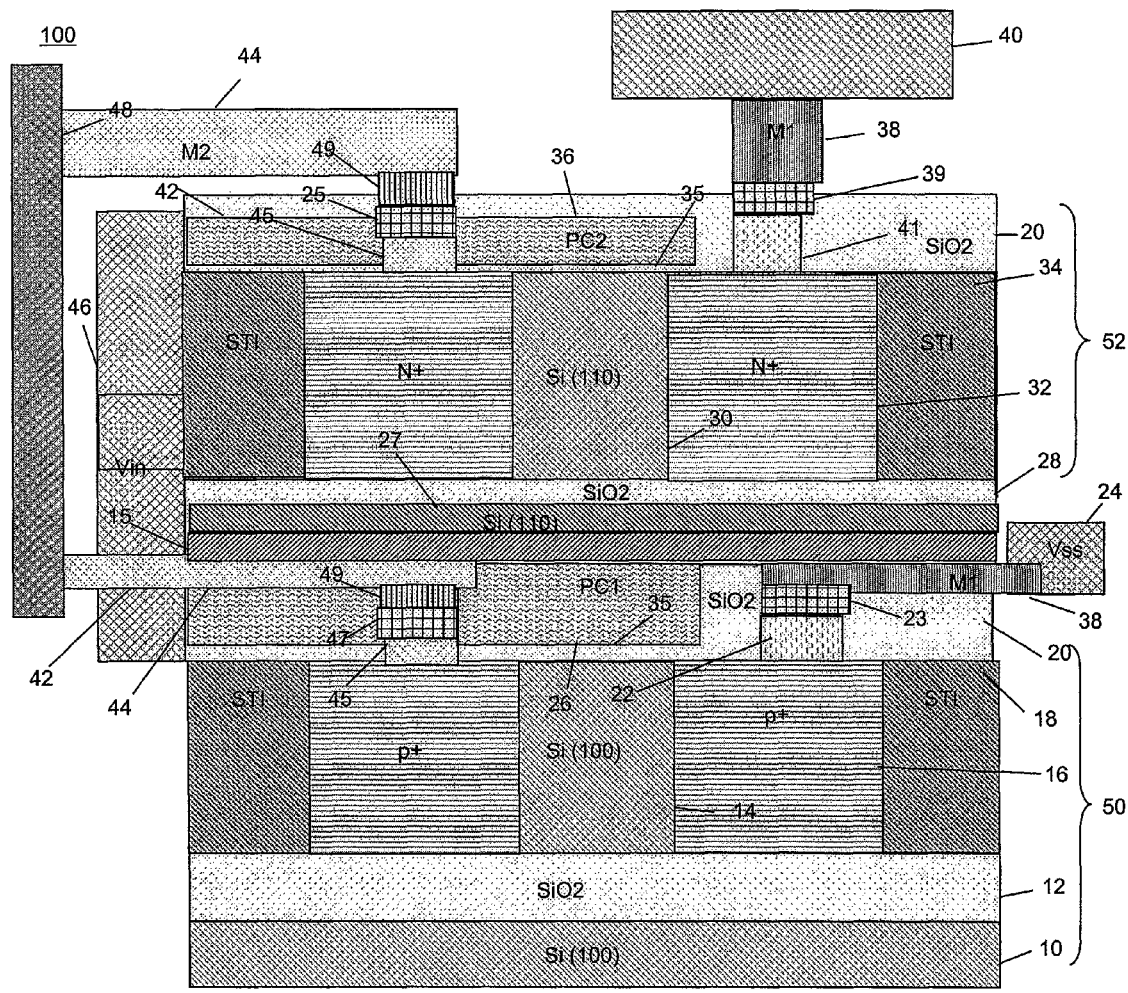
FIG. 1 illustrates an embodiment of a multilayer device in accordance with the invention.

Referring to FIG. 1, an embodiment of a multilayer device in accordance with the invention is shown. FIG. 1 may equally represent a fabrication process. The multilayer device 100 includes a first device 50, for example, a pFET, onto which a second device 52, for example, an nFET, is bonded. The first device 50 and the second device 52 each have a different crystal orientation from one another in the active region of the multilayer device 100.

In more detail, the first device 50 has Si substrate 10 with a crystal orientation of [100] and a $SiO_2$ layer 12 is formed on top of the silicon (Si) substrate 10. On top of the $SiO_2$ layer 12, a Si layer 14 is formed having a crystal orientation of [100]. Trenches are etched and filled with an insulating material such as an oxide to form shallow trench isolations 18 on either side of the active region of the first Si layer 14. Source/drain regions 16 are formed next to shallow trench isolations 18 in the first Si layer 14. The source/drain regions 16 are formed by any of the methods well known in the art for forming source/drain regions.

The upper surface of the first Si layer 14 is planarized after the source/drain regions 16 are formed using any of the methods well known in the art to planarize a Si layer. A second $SiO_2$ layer 20 is formed on the top surface of the first Si layer 14. A first gate 26 is then formed within the second $SiO_2$ layer 20 such that a portion of the first $SiO_2$ layer 20 forms a gate oxide for the first gate 26 of the first device 50.

In addition to the first device 50 being formed, the second device 52 is also formed using similar fabrication methods appropriate for producing the second device 52. However, the second device 52 has a crystal orientation in its active region different from the first device 50. This is possible due to the separate fabrication processes of each of the devices, prior to bonding. Accordingly, a second Si layer 30 having a crystal orientation of [110] is formed to be the active region of the second device 52. Trenches are etched into the second Si layer 30 and filled with an insulator such as an oxide using any of the methods well known in the art for forming and filling a trench to create second shallow trench isolations 34. Source/drain regions 32 are formed next to the shallow trench isolations 34. The source/drain regions 32 of the second device 52 are formed by any of the methods well known in the art for forming source/drain regions 32 of the second device 52.

After the source/drain regions 32 are formed in the second device 52, a gate oxide 35 is formed on top of the active region of the second Si layer 30. The gate oxide 35 may be formed by any of the techniques well known in the art for forming a gate oxide. After the gate oxide 35 is formed, a gate 36 is formed on top of the gate oxide 35, thus completing the formation of the second device 52.

Once the poly gate 36 of the second device 52 is formed, metal contacts to the various inputs of the second device 52 are formed. For example, a first and second metal 38 are formed in contact with the source/drain regions 32 of the second device. Additionally, a lower poly contact 42 to voltage bus 46 is formed in contact with the poly gate 36.

Once the first device 50 and the second device 52 are formed, the second device 52 is bonded to the top of the first device 50 with a bonding layer 15. The bonding layer 15 attaches a top of the first device 50 to a bottom of the second device 52 and attaches to a Si layer 27 with a crystal orientation of [110] formed on a bottom of the second device 52. The bonding layer 15 bonds the upper device 52 to the lower device 50 using methods and materials well known in the art for bonding one device to another. The bonding layer 15 may include any insulating substance capable of bonding a first semiconductor device to a second semiconductor device, such as, for example, nanocleave method.

After the first device 50 and the second device 52 are bonded to one another, metal plugs are formed between the various metal connections of the first and second devices, 50 and 52. The source/drain of the upper and lower devices are connected to a metal plug 48 or $V_O$, and the source/drain of the upper device is connected to voltage bus 40, such as for example, $V_{dd}$. Similarly the source/drain of the lower device is connected to $V_{ss}$ 24. Both gates are connected through a metal plug 46 or $V_{in}$.

The metal 38 is connected to the device through metal connect 41 MC and CA connect 39. Similarly, metal 2 44 is connected to the device through MC connect 45, and CA connects 25 and 47, and viaone 49, respectively.

In operation, the multilayer device of FIG. 1, where the first device 50 is a pFET and the second device 52 is an nFET, is configured to function as a CMOS inverter. The CMOS inverter is configured to occupy half the surface area on the chip due to its multilayer structure. Additionally, the first and second devices, 50 and 52, of the CMOS device 100 are internally connected to one another, as discussed above, thereby simplifying the input and output leads to the CMOS device 100. It should be noted that the voltage buses, 24 and 40, may be laid out horizontally or vertically, due to the multilayer structure of the devices, 50 and 52. Also, in this manner, since the devices 50 and 52 are formed separately, it is now possible to obtain a stacked structure with different crystal orientations in the active region.

Figure 2:
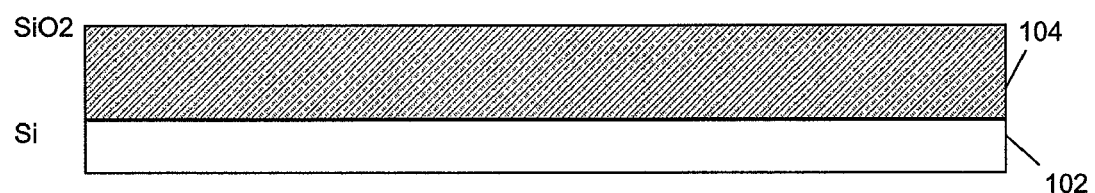
FIGS. 2-7 illustrates steps in fabricating a multilayer device in accordance with the invention.
Figure 3:
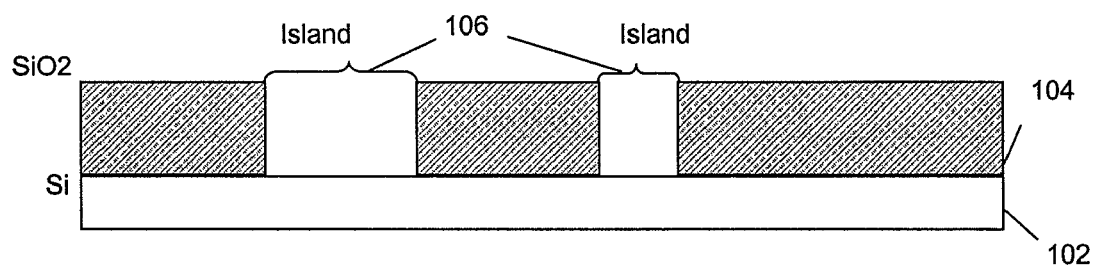

Referring to FIGS. 2-7, a method of forming an SOI island to form an active region of an embodiment of the invention is shown. Referring to FIG. 2, a silicon wafer Si substrate 102 is shown. On top of the Si substrate 102, a thick oxide layer 104 is grown. The thick oxide layer 104 can be grown using any of the methods well known in the art for growing oxide layers such as dry or wet oxidation methods. Referring to FIG. 3, a photoresist is deposited, imaged and patterned on top of the thick oxide 104. Next, the photoresist is used as a mask to etch islands 106 in the thick oxide layer 104. The islands 106 are etched down to the bottom of the thick oxide layer 104 and do not penetrate into the Si substrate 102.

Figure 4:
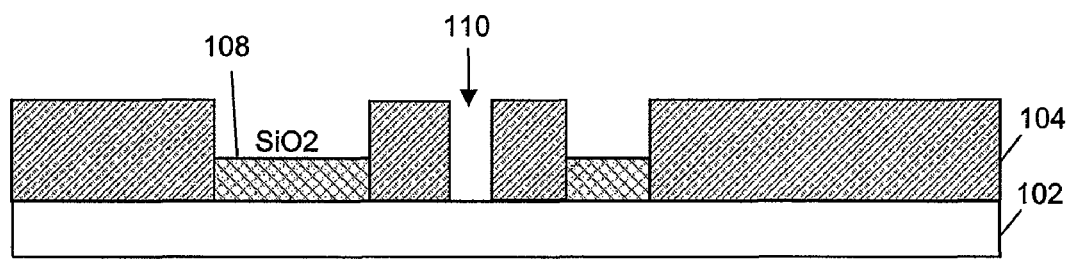

Referring to FIG. 4, a thin oxide 108 is formed at the bottom of the islands 106 on top of the Si wafer 102. The thin oxide 108 may be formed by any of the methods well known in the art to form a thin oxide layer in the bottom of a trench. Additionally, a seed hole 110 is opened from top to bottom of the thick oxide layer 104. Accordingly, the seed hole 110 passes through the thick oxide layer 104 and terminates at the Si substrate 102 allowing access to the Si substrate 102 from the top of the structure. The seed hole 110 was formed between the islands 106 using suitable etch methods known in the art such as plasma etching.

Figure 5:
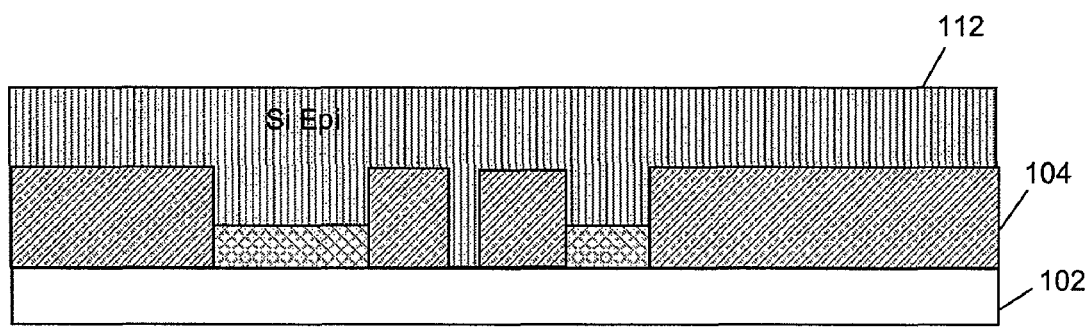

Referring to FIG. 5, an epitaxial lateral overgrowth ("ELO") growing method is used to grow silicon starting at the bottom of the seed hole 110 on top of the exposed Si substrate 102. The ELO layer grows up and out of the seed hole 110 and over the top of the thick oxide 104 and down into the islands 106 to fill the islands 106 with silicon. Thus, a Si layer 112 is formed within a top of the islands 106, within the seed hole 110, over the top of the thick oxide 104. Because the Si layer 112 is grown starting at the top of the Si substrate 102, the crystal orientation of the silicon in the Si layer 112 is the same as the crystal orientation of the silicon in the Si substrate 102.

Figure 6:
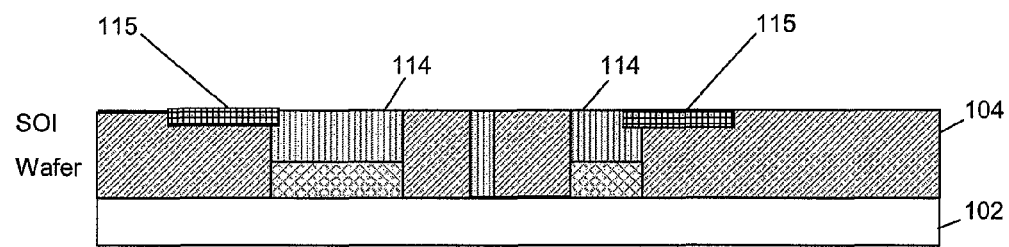

Referring to FIG. 6. After the Si layer 112 is formed, chemical mechanical polishing ("CMP") is used to remove the Si 112 which protrudes above the top surface of the thick oxide 104. Consequently, the thick oxide 104 is used as a local polish stop while the structure is planarized to isolate the silicon in the islands 106. Accordingly, the silicon of the Si layer 112 is left remaining in the islands 106 to form SOI islands 114. The SOI islands 114 are isolated from the silicon within the seed hole 110.

As mentioned above, because the Si layer 112 is grown while the seed is in contact with the Si substrate 102, the resulting Si layer 112 will have the same crystal orientation as the Si substrate 102. Furthermore, because the SOI islands 114 are formed from the Si layer 112, the SOI islands 114 will have the same crystal orientation as the Si substrate 102.

After the SOI islands 114 are formed, standard PMOS or NMOS processes may be utilized to form either a PMOS or NMOS device including forming source/drain regions, gate structures and metal contacts. Where the SOI islands 114 will form a PMOS device which will function as a first layer of a multilayer SOI device, a thick oxide layer will be formed on top of the PMOS device. Once a first layer PMOS device and a second layer NMOS device are formed, the NMOS device is bonded on top of the PMOS device forming the multilayer SOI device. It should be noted that the SOI islands of the NMOS device are grown with a crystal orientation of [100] and PMOS has an orientation of [110].

Figure 7:
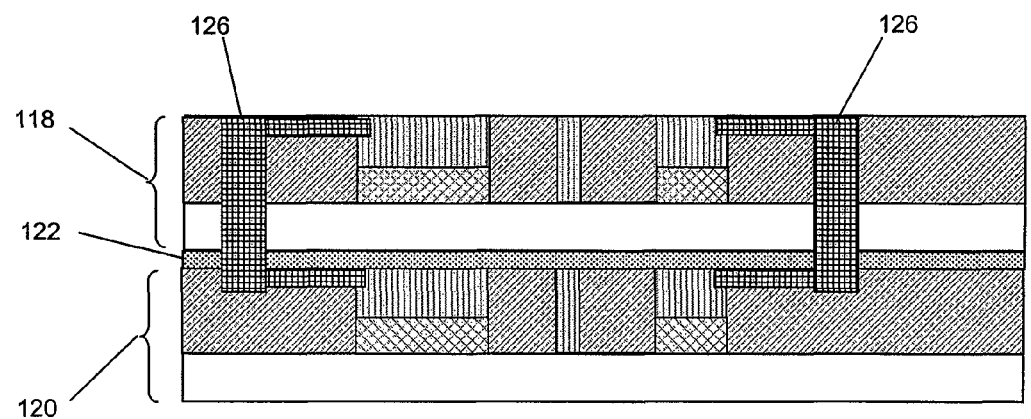

For example, referring to FIG. 7, a first layer device 120 is bonded to a second layer device 118 with a thick oxide layer 122. Once the first layer 120 and second layer 118 are bonded to one another, the structure is etched to form viaplug holes. After the via plug holes are etched, a low temperature chemical vapor deposition ("CVD") process is used to fill the via plugs with tungsten forming tungsten plugs 126. Once the tungsten plugs 126 have been formed, CMP is used to planarize the tungsten plugs 126 and final passivation is performed. Although the example shows a two layer device for illustration purposes, the method may be extended to produce any desired number of layers with each layer having practically any desired crystal orientation.

Advantages of the multilayer SOI device include a reduction of about 50% of the area needed to create a circuit and using different crystal orientations for different devices. Additionally, where multilayer devices are symmetrical, the mask may be shared.

While the invention has been described in terms of exemplary embodiments, those skilled in the art will recognize that the invention can be practiced with modifications and in the spirit and scope of the appended claims.

What is claimed is:

1. A method of forming a circuit, comprising the steps of:
   forming a lower semiconductor device having a first active region comprising a semiconductor with a first crystal orientation;
   forming, separately, an upper semiconductor device having a second active region comprising a semiconductor with a second crystal orientation; and
   in a separate step after the forming the upper semiconductor device, superimposing the formed upper semiconductor device on the lower semiconductor device, wherein:
   the forming the lower semiconductor device comprises:
      forming a first insulating layer on top of a first substrate;
      forming a seed hole and at least one trench in the first insulating layer;
      epitaxially growing silicon starting at a bottom of the seed hole, up and out of the seed hole, over a top of the first insulating layer, and down into the at least one trench to form at least one silicon island in the first insulating layer; and
      polishing to remove the epitaxially grown silicon that extends above the top surface of the first insulating layer;
      wherein the first active region is comprised in the at least one silicon island and has a same crystal orientation as the first substrate;
   the forming the upper semiconductor device comprises forming:
      a second substrate;
      a second insulating layer on top of the second substrate; and
      the second active region on top of the second insulating layer;
   the superimposing comprises forming a bonding layer between a top of the lower semiconductor device and a bottom of the upper semiconductor device, wherein the bonding layer contacts a bottom portion of the second substrate and bonds the upper semiconductor device to the lower semiconductor device; and
   the first crystal orientation is different from the second crystal orientation.

2. The method of claim 1, further comprising bonding the upper semiconductor device to the top of the lower semiconductor device with an insulating layer.

3. The method of claim 2, further comprising electrically connecting at least a portion of the upper semiconductor device to at least a portion of the lower semiconductor device.

4. The method of claim 1, further comprising forming the lower semiconductor device as a pFET device and forming the upper semiconductor device as an nFET device.

5. The method of claim 4, further comprising forming an active region of the pFET device in a crystal orientation of [100] and forming an active region of the nFET device in a crystal orientation of [110].

6. The method of claim 1, further comprising:
   forming a gate oxide on a top of the second active region of the upper semiconductor device;
   forming a poly gate on top of the gate oxide, with an upper poly contact to a voltage bus;
   forming metal contacts connecting to inputs of the upper semiconductor device; and
   forming a lower poly contact connecting a gate of the lower semiconductor device to the voltage bus.

7. A method of forming an inverter, comprising the steps of:
   forming a lower semiconductor layer comprising a first crystal orientation by epitaxially growing silicon from an upper surface of a first substrate through a seed hole in an oxide layer on the first substrate, wherein the first substrate comprises the first crystal orientation;
   forming at least one lower source/drain region in the lower semiconductor layer;
   forming a lower gate on the lower semiconductor layer;
   forming an upper semiconductor layer comprising a second crystal orientation by epitaxially growing silicon from an timer surface of a second substrate through a seed hole in an oxide layer on the second substrate, wherein the second substrate comprises the second crystal orientation;
   forming at least one upper source/drain region in the upper semiconductor layer;
   forming an upper gate on the upper semiconductor layer to define an active region in the upper semiconductor layer;
   bonding the upper semiconductor layer to the lower semiconductor layer by forming a bonding layer that directly contacts a bottom portion of the second substrate comprising the second crystal orientation;
   electrically connecting a first one of the at least one lower source/drain region to a first one of the at least one upper source/drain region;
   electrically connecting a second one of the at least one lower source/drain region to
   electrically connecting a second one of the at least one upper source/drain region to $V_{dd}$; and
   electrically connecting the lower gate to the upper gate.

8. The method of claim 7, further comprising forming the first crystal orientation as [100] and forming the second crystal orientation as [110].

9. The method of claim 8, further comprising electrically connecting the at least one lower source/drain region to the at least one upper source/drain region with metal plugs.

10. The method of claim 7, further comprising forming the lower semiconductor layer as a pFET device, and forming the upper semiconductor layer as an nFET device.

11. The method of claim 7, further comprising bonding the upper semiconductor layer to the lower semiconductor layer with an insulator.

12. The method of claim 7, further comprising bonding the upper semiconductor layer to the lower semiconductor layer with $SiO_2$.

13. The method of claim 9, wherein the bonding comprises forming the bonding layer between a top of the lower semiconductor layer and a bottom of the upper semiconductor layer, wherein the bonding layer bonds the upper semiconductor layer to the lower semiconductor layer.

14. A method of forming a circuit, comprising:
forming a lower semiconductor device comprising:
- forming a first Si substrate having a first crystal orientation of [100];
- forming a first SiO$_2$ layer on top of the first Si substrate; and
- forming a seed hole and at least one trench in the first SiO$_2$ layer;
- forming a first active region comprising a semiconductor with the first crystal orientation formed on top of the first SiO$_2$ layer by epitaxially growing silicon starting at a bottom of the seed hole, up and out of the seed hole, over a top of the first SiO$_2$, layer, and down into the at least one trench to form at least one silicon island in the first SiO$_2$ layer;
- polishing to remove the epitaxially grown silicon that extends above the top surface of the first SiO$_2$ layer; and
- forming a first gate on the first active region;

forming an upper semiconductor device comprising:
- forming a second Si substrate having a second crystal orientation of [110];
- forming a second SiO$_2$ layer atop the second Si substrate; and
- forming a second active region comprising a semiconductor with the second crystal orientation on top of the second SiO$_2$ layer; and
- forming a second gate on the second active region;

bonding the upper semiconductor device to the lower semiconductor device by forming a bonding layer between a top of the lower semiconductor device and a bottom of the upper semiconductor device, wherein the bonding layer directly contacts a bottom portion of the second Si substrate and bonds the upper semiconductor device to the lower semiconductor device; and electrically connecting the first gate to the second gate through a voltage bus, wherein the upper semiconductor device is formed separately from the lower semiconductor device and connected thereto by an interconnect structure, and the first crystal orientation is different from the second crystal orientation.

* * * * *